US006060222A

United States Patent [19]

West et al.

[11] Patent Number: 6,060,222
[45] Date of Patent: *May 9, 2000

[54] 1POSTITVE-WORKING IMAGING COMPOSITION AND ELEMENT AND METHOD OF FORMING POSITIVE IMAGE WITH A LASER

[75] Inventors: Paul R. West, Fort Collins; Jeffery A. Gurney, Greeley; John E. Walls, Fort Collins, all of Colo.

[73] Assignee: Kodak Polcyhrome Graphics LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/752,698

[22] Filed: Nov. 19, 1996

[51] Int. Cl.[7] .............................. G03F 7/30; G03F 7/004

[52] U.S. Cl. ...................... 430/326; 430/270.1; 430/330; 430/944

[58] Field of Search ................................ 430/270.1, 944, 430/326, 330

[56] References Cited

U.S. PATENT DOCUMENTS

| | | | |
|---|---|---|---|
| 3,779,778 | 12/1973 | Smith et al. | 430/270.1 |
| 4,101,323 | 7/1978 | Buhr et al. | 96/35 |
| 4,247,611 | 1/1981 | Sander et al. | 430/286 |
| 4,248,957 | 2/1981 | Sander et al. | 430/270 |
| 4,250,247 | 2/1981 | Sander et al. | 430/270 |
| 4,311,782 | 1/1982 | Buhr et al. | 430/270 |
| 4,421,844 | 12/1983 | Buhr et al. | 430/326 |
| 4,506,006 | 3/1985 | Ruckert | 430/325 |
| 4,678,737 | 7/1987 | Schneller et al. | 430/270 |
| 4,708,925 | 11/1987 | Newman | 430/270 |
| 4,789,619 | 12/1988 | Ruckert et al. | 430/270.1 |
| 4,840,867 | 6/1989 | Elsaesser et al. | 430/156 |
| 5,085,972 | 2/1992 | Vogel | 430/270.1 |
| 5,149,613 | 9/1992 | Stahlhofen et al. | 430/296 |
| 5,216,158 | 6/1993 | Pawlowski et al. | 544/216 |
| 5,227,277 | 7/1993 | Waterman | 430/253 |
| 5,286,602 | 2/1994 | Pawlowski et al. | 430/270 |
| 5,314,786 | 5/1994 | Roeschert et al. | 430/270 |
| 5,340,699 | 8/1994 | Haley et al. | 430/302 |
| 5,346,806 | 9/1994 | Pawlowski et al. | 430/284 |
| 5,491,046 | 2/1996 | DeBoer et al. | 430/302 |
| 5,527,659 | 6/1996 | Yamaoka et al. | 430/270.1 |
| 5,663,037 | 9/1997 | Haley et al. | 430/178.1 |
| 5,712,078 | 1/1998 | Huang et al. | 430/270.1 |
| 5,731,123 | 3/1998 | Kawamura et al. | 430/176 |
| 5,763,134 | 6/1998 | Busman et al. | 430/157 |
| 5,786,125 | 7/1998 | Tsuchiya et al. | 430/272.1 |
| 5,840,467 | 11/1998 | Kitatani et al. | 430/302 |

FOREIGN PATENT DOCUMENTS

| | | | |
|---|---|---|---|
| 0 708 368 A1 | 10/1994 | European Pat. Off. | G03F 7/004 |
| 0823327 | 2/1998 | European Pat. Off. . | |
| 4410441 1 | 9/1994 | Germany | G03F 7/039 |
| 1245924 | 9/1971 | United Kingdom . | |
| 9739894 | 10/1997 | WIPO . | |

*Primary Examiner*—John S. Chu
*Attorney, Agent, or Firm*—Ratner & Prestia

[57] ABSTRACT

A positive image can be obtained from a positive-working element that is sensitive to infrared radiation. The element comprises an imaging layer containing an alkali-soluble reactive resin (such as a phenolic resin), an infrared radiation absorbing compound, a thermochemical acid generating compound, and a dissolution inhibitor that has acid-cleavable C—O—C groups. Upon laser exposure, a Bronsted acid is generated which then breaks the bonds of the C—O—C groups, allowing the exposed regions of the reactive resin to be solubilized in an alkaline developer solution.

32 Claims, No Drawings

1POSTITVE-WORKING IMAGING COMPOSITION AND ELEMENT AND METHOD OF FORMING POSITIVE IMAGE WITH A LASER

FIELD OF THE INVENTION

This invention relates to an imaging composition and element useful for providing a positive image. It also relates to a method for providing a positive image by laser imaging of the noted imaging element.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portions that are exposed become soluble so that they are removed in the developing process. Such a plate is referred to in the art as a positive-working printing plate. Conversely, when the portions of the coating that are exposed become hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate under vacuum to insure good contact. The plate is then exposed to a light source, a portion of which is composed of UV radiation.

Various useful printing plates that can be either negative-working or positive-working are described, for example, in GB 2,082,339 (Horsell Graphic Industries) and U.S. Pat. No. 4,927,741 (Garth et al), both of which describe imaging layers containing an o-diazonaphthoquinone and a resole resin, and optionally a novolac resin. Another plate is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic film.

Direct digital imaging of offset printing plates is a technology that has assumed considerable importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al). This technology relies upon ablation to physically remove one or more layers from the printing plate. Ablation requires high laser fluences, resulting in slower imaging and problems with debris after imaging.

A higher speed and cleaner technology is described in U.S. Pat. No. 5,340,699 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates typically comprise a resole resin, a novolac resin, a latent Bronsted acid and an infrared absorbing compound. Other additives, such as various photosensitizers, may also be included.

The use of dissolution inhibitor compounds having acid-cleavable C—O—C groups in positive-working printing plates is also known. Representative of such compounds are the ortho carboxylic acid esters described in U.S. Pat. No. 4,101,323 (Buhr et al) and the polyacetals described in U.S. Pat. No. 4,247,611 (Sander et al). These compounds prevent dissolution of normally alkali-soluble phenolic resins in alkaline developer solutions.

Moreover, the dissolution inhibitors are generally mixed with photolytic acid-generating compounds in the photosensitive layers of the printing plates. Upon imagewise exposure of the layers to visible or ultraviolet light, an acid is released from the photolytic acid-generating compound which then catalyzes the decomposition of the dissolution inhibitors in the exposed regions. When this occurs, the phenolic resins can then be dissolved in alkaline developer compositions to provide a positive image in the exposed regions.

A number of such imaging systems are known, as described, for example, in U.S. Pat. No. 4,101,323 (noted above), U.S. Pat. No. 4,247,611 (noted above), U.S. Pat. No. 4,421,844 (Buhr et al), U.S. Pat. No. 4,506,006 (Ruckert), U.S. Pat. No. 4,678,737 (Schneller et al), U.S. Pat. No. 4,840,867 (Elsaesser et al), U.S. Pat. No. 5,149,613 (Stahlhofen et al), U.S. Pat. No. 5,286,602 (Pawlowski et al), U.S. Pat. No. 5,314,786 (Roeschert et al) and U.S. Pat. No. 5,346,806 (Pawlowski et al). However, all of these systems require irradiation and acid generation from UV or visible light irradiation.

Laser imaging of layers containing acid-cleavable groups has been disclosed in U.S. Pat. No. 5,314,786 (noted above) in which krypton-fluoride lasers emitting in the deep UV are used to provide positive images. The imaging layers described in this patent contain O,N-polyacetals, polyhydroxystyrene binder resins, polyacetal dissolution inhibitors and hydroxyethoxytriazine acid generating compounds. An argon ion laser is described in U.S. Pat. No. 4,506,006 (noted above) for use with similar photosensitive printing plates. Such a laser would have an emission wavelength at either 351 or 488 nm. A similar composition is described in U.S. Pat. No. 5,149,613 (noted above) to provide negative images by floodwise exposure followed by imaging with a krypton laser emitting at 647 or 676 nm.

There remains a need for compositions containing phenolic resin dissolution inhibitors and thermochemical acid-generating compounds that can be easily laser imaged in the infrared or near infrared regions of the spectrum at moderate power levels to provide positive images.

SUMMARY OF THE INVENTION

An advance in the art has been provided with a positive-working, infrared radiation sensitive imaging composition comprising:

a) an alkali-soluble reactive resin, b) an infrared radiation absorbing compound, c) a thermochemical acid-generating compound that provides a Bronsted acid upon infrared irradiation, and d) an alkali-dissolution inhibitor having an acid-cleavable C—O—C group that inhibits alkali-solubility of the reactive resin.

This invention also provides a positive-working, infrared radiation sensitive element comprising a support and having thereon a positive-working, infrared radiation sensitive layer comprising the positive-working infrared radiation sensitive imaging composition as described above.

Moreover, a method of this invention for providing a positive image comprises:

A) imagewise exposing the positive-working, infrared radiation sensitive element described above with an infrared radiation emitting laser, and B) contacting the exposed element with an aqueous alkaline developer solution to remove the exposed areas of the infrared radiation sensitive layer to provide a positive image.

The imaging composition and element of this invention are useful for providing high quality, continuous or half-tone positive images in a simple manner using moderately powered infrared or near-infrared radiation emitting lasers. No floodwise exposure or post-imaging heating step is needed. The element can be conveniently imaged in plate-setters or on printing presses at room temperatures at a suitable imaging rate. It was surprising that moderately powered lasers could be used in this manner, and that exposure to other sources of radiation or post-imaging heating could be avoided.

These advantages are achieved by formulating an infrared radiation sensitive imaging composition to include a reactive resin (such as a phenolic resin) that is normally soluble in aqueous alkaline developer solutions. Dissolution of the resin is inhibited, however, with a conventional dissolution inhibitor compound having acid-cleavable C—O—C groups. When such groups are cleaved by generation of a Bronsted acid in the imaged or exposed regions of the imaging layer, the inhibitor loses its effect and the resin is dissolved in the developer solution. The imaging composition of this invention, however, unexpectedly utilizes a thermochemical Bronsted acid generating compound rather than merely a photolytic Bronsted acid generating compound so laser imaging can be used without the need for actinic or UV irradiation to generate the Bronsted acid. Moreover, use of thermochemical means to generate the acid renders the element of this invention handleable in room light.

DETAILED DESCRIPTION OF THE INVENTION

The alkali-soluble reactive resins useful in the practice of this invention are water-insoluble, but soluble in alkaline solutions having a pH of at least 9. The phenolic resins defined below are most preferred, but other useful reactive resins would be readily apparent to a skilled worker in the art. Conventional aqueous alkaline solutions include lithographic printing plate developer solutions as identified below.

The phenolic resins useful herein are light-stable, water-insoluble, alkali-soluble film-forming resins that have a multiplicity of hydroxy groups either on the backbone of the resin or on pendant groups. The resins typically have a molecular weight of at least about 350, and preferably of at least about 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or an aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al) and U.S. Pat. No. 4,306,011 (Uehara et al) which are prepared by reacting a polyhydric alcohol and an aldehyde or ketone, several of which are described in the patents. Still other useful phenolic resins are described in U.S. Pat. No. 5,368,977 (Yoda et al) and EP-A-0 708 368 (Fuji Photo).

A mixture of the reactive resins described above can be used, but preferably, a single novolac resin is present in the photosensitive composition. The reactive resins are either commercially available from a number of sources, or prepared using known procedures and starting materials.

When the imaging composition is formulated as a coating composition in suitable coating solvents, the reactive resin is present in an amount of at least 0.5 weight percent. Preferably, it is present in an amount of from about 1 to about 10 weight percent.

In the dried imaging layer of the element of this invention, the reactive resin is the predominant material. Generally, it comprises at least 25 weight percent of the layer, and more preferably, it is from about 60 to about 90 weight percent of the dried layer.

A second essential component of the imaging composition is an infrared radiation absorbing compound (or IR absorbing compound), or mixture thereof. Such compounds typically have a maximum absorption wavelength ($\lambda_{max}$) in the region of at least about 750 nm, that is in the infrared region and near infrared of the spectrum, and more particularly, from about 800 to about 1100 nm. The compounds can be dyes or pigments, and a wide range of compounds are well known in the art (including U.S. Pat. No. 4,912,083, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,952,552, U.S. Pat. No. 4,973,572, U.S. Pat. No. 5,036,040 and U.S. Pat. No. 5,166,024). Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful infrared absorbing dyes are of the cyanine class. These materials are available from a number of commercial sources.

The amount of infrared radiation absorbing compound in the dried imaging layer is generally sufficient to provide an optical density of at least 0.5 in the layer, and preferably, an optical density of from about 1 to about 3. This range would accommodate a wide variety of compounds having vastly different extinction coefficients. Generally, this amount is at least 1 weight percent, and preferably from 5 to 25 weight percent.

The imaging composition of this invention also includes one or more dissolution inhibitors having acid-cleavable C—O—C groups. Many classes of such compounds are known in the art, including for example U.S. Pat. No. 4,101,323 (noted above), U.S. Pat. No. 4,247,611 (noted above), U.S. Pat. No. 4,421,844 (noted above), U.S. Pat. No. 4,506,006 (noted above), U.S. Pat. No. 4,678,737 (noted above), U.S. Pat. No. 4,840,867 (noted above), U.S. Pat. No. 5,149,613 (noted above), U.S. Pat. No. 5,286,602 (noted above), U.S. Pat. No. 5,314,786 (noted above) and U.S. Pat. No. 5,346,806 (noted above), all incorporated herein by reference with respect to their teaching about such compounds. The methods for preparing these compounds are also well known, and some are commercially available.

Particularly useful dissolution inhibitors can be defined as monomeric or polymeric acetals having recurring acetal or ketal groups, monomeric or polymeric ortho carboxylic acid esters having at least one ortho carboxylic acid ester or amide group, enol ethers, N-acyliminocarbonates, cyclic acetals or ketals, β-ketoester or β-ketoamides, and others that would be readily apparent to one skilled in the art. The preferred dissolution inhibitors include the mono- or bis-ortho carboxylic acid aryl or alkyl esters described in U.S. Pat. No. 4,101,323 (noted above). Other useful ortho carboxylic acid esters are described as diphenyl methyl ethers of aliphatic or aromatic hydroxy compounds, N-diphenoxy methyl derivatives of lactams and bis-1,3-dioxan-2-yl-ethers of aliphatic diols in U.S. Pat. No. 4,421,844 (noted above).

The amount of dissolution inhibitor in the imaging composition of this invention is at least about 10%, and preferably from about 20 to about 40%, based on the total dry weight of the composition.

Another essential component of the imaging composition of this invention is one or more strong thermochemical acid-generating compounds. Such compounds release a Bronsted acid upon exposure to the heat generated by infrared or near-infrared irradiation using an IR laser. Useful thermochemical acid-generating compounds can be described as halogenated organic compounds capable of forming hydrohalic acids, benzaldoximes, oxalic acid esters, diazonium, phosphonium, sulfonium and iodonium salts, o-nitrobenzyl esters, N-hydroxyimide sulfonates, sulfonic acid esters or phenols and imino sulfonates.

Representative compounds of these various classes of thermochemical Bronsted acid generating compounds are described, for example, in U.S. Pat. No. 4,101,323, U.S. Pat. No. 4,421,844, U.S. Pat. No. 5,149,613 and U.S. Pat. No. 5,314,786, all noted above and incorporated herein by reference for their description of such compounds, and in U.S. Pat. No. 5,227,277 (Waterman) and EP 708,368 (Fuji Photo), also incorporated herein by reference.

Particularly useful compounds include halogenated compounds such as halogenated triazines (or s-triazine derivatives), halogenated 2-pyrones, halogenated oxazoles, halogenated oxadiazoles, and halogenated thiazoles. Generally, such compounds have polyhalomethyl groups, such as trihalomethyl groups that can generate the desired hydrohalic acid upon heating from infrared irradiation.

Particularly useful thermochemical acid-generating compounds are the halogenated triazines that are substituted with at least one trihalomethyl group. Representative compounds include, but are not limited to, 2-phenyl-4,6-bis (trichloromethyl)-s-triazine, 2-(p-chlorophenyl)-4,6-bis (trichloromethyl)-s-triazine, 2-(p-tolyl)-4,6-bis (trichloromethyl)-s-triazine, 2-(p-methoxyphenyl)-4,6-bis (trichloromethyl)-s-triazine, 2-(2', 4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl-4,6-bis(trichloromethyl)-s-triazine. In addition, there can be mentioned the compounds described in GB 1,388,492, and *J. Org. Chem.*, Vol. 29, page 1527 (1964), both incorporated herein by reference.

The most preferred halogenated triazine is 2,4-bis (trichloromethyl)-6-(1-naphthyl)-s-triazine or its 4-methoxy derivative.

The amount of thermochemical Bronsted acid-generating compound in the imaging composition of this invention is at least 0.5 %, and preferably from about 1 to about 10%, based on total dry weight of the composition.

Optional, non-essential components of the imaging composition include colorants, sensitizers, stabilizers, exposure indicators and surfactants in conventional amounts. In preferred embodiments, a surfactant (such as silicone material) may be present.

Obviously, the imaging composition is coated out of one or more suitable organic solvents that have no effect on the sensitivity of the composition. Various solvents for this purpose are well known, but acetone and 1-methoxy-2-propanol are preferred. The components of the composition are dissolved in the solvents in suitable proportions.

Suitable conditions for drying the imaging composition involve heating for a period of time of from about 0.5 to about 5 minutes at a temperature in the range of from about 20 to about 150° C.

To form an element of this invention, the imaging composition is applied (usually by coating techniques) onto a suitable support, such as a metal, polymeric film (for example, a polyester, polyamide, polycarbonate or cellulose acetate film), ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974 (Walls et al). Such elements are generally known as lithographic printing plates, but other useful elements of this invention include printed circuit boards or photoresists.

The thickness of the resulting imaging layer, after drying, on the support can vary widely, but typically it is in the range of from about 0.5 to about 2 μm, and preferably from about 1 to about 1.5 μm.

No other essential layers are provided on the element. In particular, there is no protective or other type of layer over the imaging layer. Optional, but not preferred subbing or antihalation layers can be disposed under the imaging layer, or on the backside of the support (such as when the support is a transparent polymeric film).

The elements described herein are uniquely adapted for "direct-to-plate" imaging applications. Such systems utilize digitized image information, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed element of this invention. Thus, no exposed and processed films are needed for imaging of the elements, as in the conventional lithographic imaging processes.

Laser imaging can be carried out using any moderate or high-intensity laser diode writing device providing irradiation in the infrared or near-infrared regions of the spectrum. Specifically, a laser printing apparatus is provided that includes a mechanism for scanning the write beam across the element to generate an image without ablation. The intensity of the write beam generated at the laser diode source at the element is at least about 10 milliwatts/$cm^2$ (preferably from 10 to 1000 milliwatts/$cm^2$). During operation, the element to be exposed is placed in the retaining mechanism of the writing device and the write beam is scanned across the element to generate an image.

Laser imaging causes the acid-generating compound to release a Bronsted acid which then attacks the acid-cleavable C—O—C groups in exposed regions of the imaging layer. With the dissolution inhibitor ineffective in the exposed regions, the reactive resin can be dissolved in alkaline solutions.

Following laser imaging, the element is then developed in an alkaline developer solution until the image (or exposed) areas are removed to provide the desired positive image. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK PRODUCTION SERIES MX 1589 Machine Developer.

No other processing steps are essential in the practice of this invention, but an optional step is treatment of the element with a finisher containing gum arabic or a hydrolyzed starch.

The following examples are provided to illustrate the practice of this invention, and not to limit it in any manner. Unless otherwise noted, all percentages are by weight.

EXAMPLE 1

An imaging coating formulation was prepared as follows:

| COMPONENT | PARTS |
|---|---|
| Cresol-formaldehyde novolac resin | 4.82 |
| 1,3-di[2-(5-ethyl-5-butyl-1,3-dioxycyclohexoxy)]-2-ethyl-2-butylpropane bis-o-ester dissolution inhibitor | 1.38 |
| 2-[2-[2-chloro-3-[(1,3-dihydro-1,1,3-trimethyl-2H-benz[e]indol-2-ylidene)-ethylidene-1-cyclohexen-1-yl]ethenyl]-1,1,3-trimethyl-1H-benz[e]indolium, salt with 4-methylbenzenesulfonic acid IR absorbing dye | 0.41 |
| 2,4-Bis(trichloromethyl)-6-(1-naphthyl)-s-triazine thermochemical acid generating compound | 0.23 |
| CG 21-1005 dye colorant | 0.10 |
| BYK 307 polyether-modified polydimethylsiloxane from BYK-Chemie | 0.03 |
| 1-Methoxy-2-propanol solvent | 93.03 |

This formulation was applied to give a dry coating weight of about 1.3 g/$m^2$ onto an electrochemically grained and sulfuric acid anodized aluminum sheet that had been further treated with an acrylamide-vinylphosphonic acid copolymer (according to U.S. Pat. No. 5,368,974, noted above) to form an unexposed lithographic printing plate.

The resulting printing plate was imaged at an intensity of 200 milliwatt at 150 rpm on an Ektron platesetter equipped with diode lasers emitting a modulated pulse centered at 830 nm. The plate was then allowed to stand at room temperature for 15 minutes, and then processed with KODAK PRODUCTION SERIES MX 1589 Machine Developer to provide a high resolution positive image.

The developed printing plate was mounted on a conventional Miehle printing press and used to provide more than 5000 impressions without image deterioration, despite the use of conditions intended to cause early plate failure.

EXAMPLE 2

Example 1 was repeated except that 3-methoxy-4-diazodiphenylamine hexafluorophosphate was used as the thermochemical acid generating compound in place of the naphthyltriazine. The resulting imaged and developed plate had a suitable positive image.

The invention has been described in detail with particular reference to preferred embodiments thereof, but it will be understood that variations and modifications can be effected within the spirit and scope of the invention.

We claim:

1. A method for providing a positive image, the method comprising, in order:

A) imagewise exposing a positive-working, infrared radiation sensitive layer of a positive-working infrared radiation sensitive element with a modulated beam of infrared or near-infrared radiation to produce an exposed element comprising exposed areas; in which:

1) the positive-working, infrared radiation sensitive element comprises a support having thereon the positive-working, infrared radiation sensitive layer;

2) the positive-working, infrared radiation sensitive layer comprises a positive-working, infrared radiation sensitive composition; and 3) the positive-working, infrared radiation sensitive composition comprises:

a) an alkali-soluble reactive resin;

b) an infrared radiation absorbing compound;

c) a thermochemical acid-generating compound that provides a Bronsted acid on infrared irradiation; and d) an alkali-dissolution inhibitor having acid-cleavable C—O—C group that inhibits alkali-solubility of the reactive resin; and B) contacting the exposed element with an aqueous alkaline developer solution to remove the exposed areas of the positive-working, infrared radiation sensitive layer to produce a positive image.

2. The method of claim 1 in which the reactive resin is a phenolic resin.

3. The method of claim 1 in which the reactive resin is a novolac resin.

4. The method of claim 1 in which the reactive resin is a cresol-formaldehyde novolac resin.

5. The method of claim 1 in which the infrared absorbing compound is a squarylium, croconate, cyanine, merocyanine, indolizine, pyrylium or metal dithiolene dye or pigment that absorbs radiation at a wavelength of from about 800 nm to about 1100 nm, and in which the infrared absorbing compound is present in an amount sufficient to provide an optical density at least 0.5.

6. The method of claim 5 in which the reactive resin is a cresol-formaldehyde novolac resin.

7. The method of claim 1 in which the thermochemical acid-generating compound is a halogenated organic compound capable of forming a hydrohalic acid.

8. The method of claim 1 in which the dissolution inhibitor is a monomeric or polymeric ortho carboxylic acid ester, monomeric or polymeric acetal, enolether, N-acyliminocarbonate, cyclic acetal or ketal, β-ketoester or β-ketoamide.

9. The method of claim 1 in which the dissolution inhibitor is a mono- or bis-ortho carboxylic acid aryl or alkyl ester.

10. The method of claim 9 in which the infrared absorbing compound is a squarylium, croconate, cyanine, merocyanine, indolizine, pyrylium or metal dithiolene dye or pigment that absorbs radiation at a wavelength of from about 800 nm to about 1100 nm; in which the infrared absorbing compound is present in an amount sufficient to provide an optical density at least 0.5; and in which the reactive resin is a cresol-formaldehyde novolac resin.

11. The method of claim 1 in which the thermochemical acid-generating compound is a halogenated triazine.

12. The method of claim 11 in which the dissolution inhibitor is a mono- or bis-ortho carboxylic acid aryl or alkyl ester; in which the infrared absorbing compound is a squarylium, croconate, cyanine, merocyanine, indolizine, pyrylium or metal dithiolene dye or pigment that absorbs radiation at a wavelength of from about 800 nm to about 1100 nm; in which the infrared absorbing compound is present in an amount sufficient to provide an optical density at least 0.5; and in which the reactive resin is a cresol-formaldehyde novolac resin.

13. The method of claim 12 in which the thermochemical acid-generating compound is present in an amount of from about 1 to about 10%, and the dissolution inhibitor is present in an amount of from about 20 to about 40%, based on total dry composition weight.

14. The method of claim 1 in which the thermochemical acid-generating compound is present in an amount of at least about 0.5%, and the dissolution inhibitor is present in an amount of at least about 10%, based on total dry composition weight.

15. The method of claim 14 in which the thermochemical acid-generating compound is present in an amount of from about 1 to about 10%, and the dissolution inhibitor is present in an amount of from about 20 to about 40%, based on total dry composition weight.

16. The method of claim 1 in which the modulated beam of infrared or near-infrared radiation has a wavelength of about from 800 to about 1100 nm.

17. The method of claim 16 in which the laser beam has an intensity of 10 to 1000 milliwatts/$cm^2$.

18. The method of claim 17 in which: (1) the thermochemical acid-generating compound is a halogenated triazine; (2) the dissolution inhibitor is a mono- or bis-ortho carboxylic acid aryl or alkyl ester; (3) the infrared absorbing compound is a squarylium, croconate, cyanine, merocyanine, indolizine, pyrylium or metal dithiolene dye or pigment that absorbs radiation at a wavelength of from about 800 nm to about 1100 nm; (4) the infrared absorbing compound is present in an amount sufficient to provide an optical density at least 0.5; (5) the reactive resin is a cresol-formaldehyde novolac resin; and (6) the modulated beam of infrared or near-infrared radiation has a wavelength of about from 800 to about 1100 nm.

19. The method of claim 1 in which the thermochemical acid-generating compound is present in an amount of from about 1 to about 10%, and the dissolution inhibitor is present in an amount of from about 20 to about 40%, based on total dry composition weight.

20. The method of claim 1 additionally comprising, after step B), treating the element with a finisher containing gum arabic or hydrolyzed starch.

21. The method of claim 1 in which the positive-working, infrared radiation sensitive composition consists essentially of the alkali-soluble reactive resin; the infrared radiation absorbing compound; the thermochemical acid-generating compound that provides a Bronsted acid on infrared irradiation; and the alkali-dissolution inhibitor having acid-cleavable C—O—C group that inhibits alkali-solubility of the reactive resin.

22. The method of claim 1 in which: the reactive resin is a novolac resin; the thermochemical acid-generating compound is a halogenated triazine; the dissolution inhibitor is a mono- or bis-ortho carboxylic acid aryl or alkyl ester; and the infrared absorbing compound is a squarylium, croconate, cyanine, merocyanine, indolizine, pyrylium or metal dithiolene dye or pigment that absorbs radiation at a wavelength of from about 800 nm to about 1100 nm.

23. The method of claim 22 in which the thermochemical acid-generating compound is present in an amount of from about 1 to about 10%, the dissolution inhibitor is present in an amount of from about 20 to about 40%, and the infrared radiation absorbing compound is present in an amount of 5 to 25%, based on total dry composition weight.

24. The method of claim 1 in which there is no post-imaging heating step.

25. The method of claim 24 in which: the reactive resin is a novolac resin; the thermochemical acid-generating compound is a halogenated triazine; the dissolution inhibitor is a mono- or bis-ortho carboxylic acid aryl or alkyl ester; and the infrared absorbing compound is a squarylium, croconate, cyanine, merocyanine, indolizine, pyrylium or metal dithiolene dye or pigment that absorbs radiation at a wavelength of from about 800 nm to about 1100 nm.

26. The method of claim 25 in which the thermochemical acid-generating compound is present in an amount of from about 1 to about 10%, the dissolution inhibitor is present in an amount of from about 20 to about 40%, and the infrared radiation absorbing compound is present in an amount of 5 to 25%, based on total dry composition weight.

27. The method of claim 1 in which there is no post-imaging exposure step.

28. The method of claim 27 in which: the reactive resin is a novolac resin; the thermochemical acid-generating compound is a halogenated triazine; the dissolution inhibitor is a mono- or bis-ortho carboxylic acid aryl or alkyl ester; and the infrared absorbing compound is a squarylium, croconate, cyanine, merocyanine, indolizine, pyrylium or metal dithiolene dye or pigment that absorbs radiation at a wavelength of from about 800 nm to about 1100 nm.

29. The method of claim 28 in which the thermochemical acid-generating compound is present in an amount of from about 1 to about 10%, the dissolution inhibitor is present in an amount of from about 20 to about 40%, and the infrared radiation absorbing compound is present in an amount of 5 to 25%, based on total dry composition weight.

30. The method of claim 27 in which there is no post-imaging heating step.

31. The method of claim 30 in which: the reactive resin is a novolac resin; the thermochemical acid-generating compound is a halogenated triazine; the dissolution inhibitor is a mono- or bis-ortho carboxylic acid aryl or alkyl ester; and the infrared absorbing compound is a squarylium, croconate, cyanine, merocyanine, indolizine, pyrylium or metal dithiolene dye or pigment that absorbs radiation at a wavelength of from about 800 nm to about 1100 nm.

32. The method of claim 31 in which the thermochemical acid-generating compound is present in an amount of from about 1 to about 10%, the dissolution inhibitor is present in an amount of from about 20 to about 40%, and the infrared radiation absorbing compound is present in an amount of 5 to 25%, based on total dry composition weight.

* * * * *